United States Patent [19]

Yamagami

[11] Patent Number: 4,459,855
[45] Date of Patent: Jul. 17, 1984

[54] SEMICONDUCTOR PRESSURE SENSOR

[75] Inventor: Kozo Yamagami, Hyogo, Japan

[73] Assignee: Mitsubishi Denki Kabushiki Kaisha, Tokyo, Japan

[21] Appl. No.: 407,362

[22] Filed: Aug. 11, 1982

[30] Foreign Application Priority Data

Aug. 12, 1981 [JP] Japan ............................. 56-127491

[51] Int. Cl.$^3$ ............................................. G01L 9/06
[52] U.S. Cl. ......................................... 73/727; 338/4; 357/26
[58] Field of Search ........... 73/721, 727, 754, DIG. 4, 73/777; 338/4; 357/26

[56] References Cited

U.S. PATENT DOCUMENTS

| | | | |
|---|---|---|---|
| 3,210,620 | 10/1965 | Lin | 357/13 |
| 4,023,562 | 5/1977 | Hynecek et al. | 73/727 |
| 4,202,217 | 5/1980 | Kurtz et al. | 73/727 |
| 4,222,277 | 9/1980 | Kurtz et al. | 73/721 |
| 4,291,293 | 9/1981 | Yamada et al. | 73/727 |
| 4,332,000 | 5/1982 | Petersen | 357/26 |

Primary Examiner—S. Clement Swisher
Assistant Examiner—John E. Chapman, Jr.
Attorney, Agent, or Firm—Sughrue, Mion, Zinn, Macpeak & Seas

[57] ABSTRACT

An improved semiconductor pressure sensor of the silicon diaphragm type is disclosed. The sensor includes a pressure sensor device composed of a substrate of monocrystalline silicon, a diffused resistive layer formed on one surface of the substrate and a cavity formed in the other surface to create a thin-walled area that includes the diffused resistive layer with the cavity surrounded by a thick-walled leg portion. A hermetic sealable cap covers the one surface of the sensor device. A conductive diffused region from which an electrical signal can be picked up is provided in the leg portion electrically connected to the diffused resistive layer.

4 Claims, 3 Drawing Figures

SEMICONDUCTOR PRESSURE SENSOR

BACKGROUND OF THE INVENTION

Pressure sensor devices of the silicon diaphragm type that use the piezoresistance effect of monocrystalline silicon have found wide use because they have a high sensitivity and low hysteresis, and devices having uniform characteristics can be fabricated in large quantities and at low cost using widely known planar IC technology. FIG. 1 shows the constructions of a conventional pressure sensor device of this type. The device, which is generally indicated at 10, is composed of an n-type silicon substrate 1 which has a resistive layer 2 on one surface thereof formed, for instance, by a combination of photoetching and ion implantation or selective diffusion of a p-type impurity such as boron. A cavity is formed in the region 4 on the opposite side of the substrate from the resistive layer by lapping or etching. This leaves a thin-walled, central portion 1a that is surrounded by a thick-walled leg portion 1b.

In this arrangement, when pressure is applied, the thin-walled portion 1a, including the diffused resistive layer 2, is deformed to cause a change in the electrical resistance of the resistive layer. Therefore, the portion 1a serves as strain-causing area. The surface of the substrate 1 is insulated and stabilized by a silicon oxide or nitride film 6.

The resistive layer 2 is connected electrically to a metallized ohmic electrode 3 formed above the leg portion 1b. Electrical connection between the ohmic electrode 3 and the diffused resistor layer 2 is established by a lead-out diffused layer formed through diffusion of an impurity of the same conductivity type as that of the resistive layer (p-type impurity in the illustrated embodiment) or by an aluminum vapor-deposited film formed on the insulating film 6 on the silicon substrate 1.

Pressure sensors of the silicon diaphragm type are presently available in two varieties according to the method of pressure measurement: (1) an absolute pressure type wherein the change in the pressure on one side of the silicon diaphragm or strain-causing area is compared with the pressure in a reference pressure compartment on the other side in which the pressure is maintained constant, and (2) a differential pressure type wherein the difference between the pressures applied to the two sides of the diaphragm is measured.

The finished construction of an absolute pressure type sensor is illustrated in FIG. 3. A complete semiconductor pressure sensor device as described above is coated with a protective insulating film 6 on the surface where the resistive layer is formed. Over the insulation film is disposed a hermetically sealable glass or metal vessel 7, attached through a sealant 9, with the inner space 8 of the vessel 7 being evacuated or filled with an inert gas or the like at a constant pressure. The area where the vessel 7 is attached to the insulating film 6 by the sealant 9 should not be above the thin-walled part 1a of the sensor device.

Due to the presence of the hermetically sealable vessel 7 on the conventional semiconductor sensor device 10 of FIG. 1, each of the electrodes 3 that are connected electrically to the resistive layer 2 must extend outside the vessel 7. This adds to the size of the device and hence makes the production cost higher than desired. As a further disadvantage, the area where the vessel 7 is attached to the insulating film 6 by the sealant 9 is in most cases close to the thin-walled part 1a of the silicon diaphragm. This causes an adverse effect on the strain characteristics, especially on the temperature dependency of the pressure vs. electrical signal output characteristics.

SUMMARY OF THE INVENTION

The primary object of the present invention is to eliminate these defects of the convention pressure sensor of the absolute pressure type and to provide a sensor that can be fabricated at low cost and which exhibits pressure vs. electrical signal output characteristics having the desired temperature dependency.

These and other objects of the invention are achieved by forming a conductive area that extends from one surface of the leg portion to the other surface.

DESCRIPTION OF THE PREFERRED EMBODIMENTS

Figure 1:
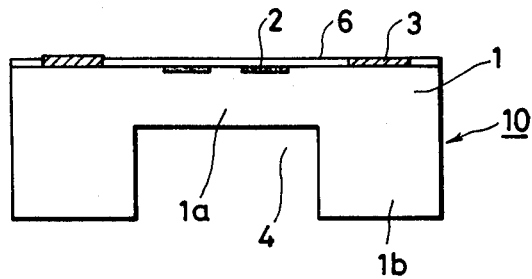
FIG. 1 shows a conventional pressure sensor of the silicon diaphragm type.
Figure 2:
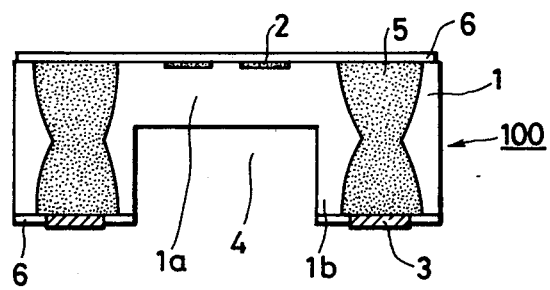
FIG. 2 shows a semiconductor pressure sensor constructed according to a preferred embodiment of the invention.
Figure 3:
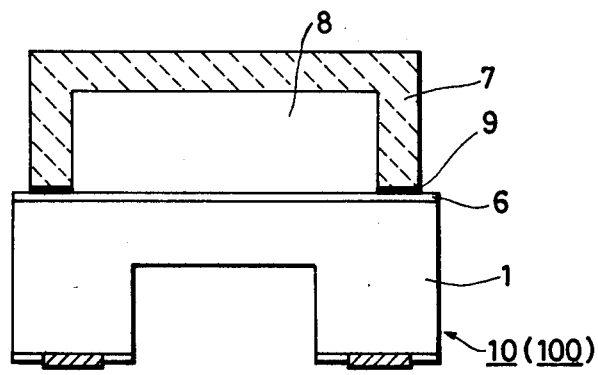
FIG. 3 shows an absolute pressure sensor.

FIG. 2 shows a semiconductor pressure sensor constructed according to a preferred embodiment of the present invention. The sensor device generally indicated at 100 may employ an n-type silicon substrate 1 of the same type as described above in conjunction with device 10 in FIG. 1. A resistive layer 2 is formed on one surface of the substrate 1 by a combination of photoetching and ion implantation or selective diffusion of a p-type impurity such as boron. A cavity is formed in the region 4 on the opposite side of the substrate from the resistive layer by lapping or chemical etching so as to form a thin-walled portion 1a that is about 30 to 50 μm thick. This strain-causing area 1a is surrounded by a thick-walled leg portion 1b. As shown in FIG. 2, a conductive region 5 is formed by diffusing a p-type impurity into the silicon substrate in the leg 1b. If more than one p-type diffused area is formed, each area must be electrically isolated from the other. The number of such diffused areas is determined by how many electrodes are necessary. Each p-type diffused area 5 makes ohmic contact with a metallized electrode 3 that is formed on the other (i.e., projecting) surface of the leg 1b of each signal pickup area. The resistive layer 2 may be electrically connected to the p-type diffused layer 5 by a conventional method, such as by bonding a vapor-deposited aluminum film or by forming a p-type diffused layer on the side of the resistive layer 2. This arrangement enables the electrical signals produced by changes in the pressure-dependent resistance of the resistive layer to be brought out from the lower ends of the legs 1b, away from the area where the sealable vessel is attached to the upper surface of the device. In this case, the entire upper surface of the silicon substrate 1 can be protected by an insulating film of silicon oxide or nitride.

An absolute pressure type pressure sensor using the device of the present invention has the following advantages:

(1) Geometrical limitations on the area at which the hermetically sealable vessel 7 is attached to the insulating film 6 are eliminated by positioning the metallized electrode 3 on the side of the leg 1b opposite the strain-causing portion 1a. Thus, the vessel can be connected to the periphery of the sensor device by applying the sealant 9 to a position satisfactorily far from the strain-causing area 1a. As a result, the sensor has pressure vs. electrical signal output characteristics having the desired temperature dependency.

(2) For the reasons mentioned in (1), the sensor is more compact than the conventional product and hence can be fabricated at a lower cost.

(3) Since the metallized electrode 3 is formed on the projecting end of the leg 1b, the sensor device 100 can be bonded directly to fittings with solder.

In the above-described embodiment, the silicon substrate 1 is described as being doped with an n-type impurity. However, it is to be understood that an equally effective pressure sensor device can be fabricated by combining a p-type silicon substrate with n-type resistive layer 2 and n-type diffused region 5.

As described in the foregoing, the sensor device of the present invention has a conductive region that extends from one surface of the leg portion to the other surface. As a result, a pressure sensor of the absolute pressure type having improved electrical output vs. temperature characteristics can be fabricated at a low cost and with a great latitude in manufacturing method.

I claim:

1. In a semiconductor pressure sensor comprising a substrate of monocrystalline silicon having a diffused resistive layer formed on one surface of the substrate and a cavity formed in the other surface of the substrate to form a thin-walled area that includes the diffused resistive layer and with the cavity surrounded by a thick-walled leg portion, and a hermetic sealable cap covering said one surface of the sensor device, the improvement wherein a diffused conductive region is provided in said leg portion and is connected electrically to said diffused resistive layer, said diffused conductive region extending from said one surface of the silicon substrate to an opposite surface at an end of said thick-walled leg.

2. The semiconductor pressure sensor according to claim 1, wherein a plurality of diffused conductive regions, which are electrically isolated from one another, are provided in said thick-walled portion.

3. The semiconductor pressure sensor according to claim 3, further comprising a metallized electrode connected to each diffused conductive region disposed on said other surface of said substrate.

4. The semiconductor pressure sensor according to any one of claims 1, 2 or 3, wherein said one surface of said substrate is covered by a protective insulating film.

* * * * *